United States Patent [19]
Huisman et al.

[11] Patent Number: 6,125,461
[45] Date of Patent: Sep. 26, 2000

[54] METHOD FOR IDENTIFYING LONG PATHS IN INTEGRATED CIRCUITS

[75] Inventors: Leendert Marinus Huisman, South Burlington, Vt.; Daniel Ray Knebel, Carmel, N.Y.; Phillip J Nigh, Williston, Vt.; Pia Naoko Sanda, Chappaqua; Xiaodong Xiao, Yorktown Heights, both of N.Y.

[73] Assignee: International Business Machines Corporation, Armonk, N.Y.

[21] Appl. No.: 09/026,286

[22] Filed: Feb. 19, 1998

[51] Int. Cl.[7] ............................. G01R 31/28; G01R 31/30
[52] U.S. Cl. ............................. 714/724; 714/745
[58] Field of Search .................................. 714/724, 731, 714/814, 815, 745; 713/401, 503; 395/500–7

[56] References Cited

U.S. PATENT DOCUMENTS

| | | | |
|---|---|---|---|
| 4,811,343 | 3/1989 | Johansson et al. | 714/55 |
| 5,351,211 | 9/1994 | Higeta et al. | 365/189.05 |
| 5,428,626 | 6/1995 | Frisch et al. | 714/744 |
| 5,504,431 | 4/1996 | Maeda et al. | 324/501 |
| 5,578,938 | 11/1996 | Kazami | 326/16 |
| 5,781,559 | 7/1998 | Muris et al. | 714/726 |
| 5,787,092 | 7/1998 | Jaynes et al. | 714/724 |
| 5,841,789 | 11/1998 | Mcclure | 714/724 |

*Primary Examiner*—Albert De Cady
*Assistant Examiner*—Shelly A Chase
*Attorney, Agent, or Firm*—Wayne L. Ellenbogen

[57] ABSTRACT

A system and method for identifying long paths in an integrated circuit are described. An integrated circuit chip is subjected to input test signals of progressively shorter cycle time until the chip fails to produce a correct output. The cycle time of the signal resulting in the failure of the chip is defined as T. A signal having cycle time $T'=T+\Delta T$ is then applied to the integrated circuit, where the signal of cycle time T' is known to result in proper operation of the chip. The chip is then observed for switching activity during the period $\Delta T$ which occurs beginning at a time T measured from the beginning of the second signal of duration T' until the end of the signal of duration T'. The location of the switching activity is used to identify the path or paths of the circuit that resulted in failure of the chip. In a preferred embodiment of the invention, the switching activity is detected using an optical measurement system capable of detecting light generated by transistor switching activity.

14 Claims, 3 Drawing Sheets

METHOD FOR IDENTIFYING LONG PATHS IN INTEGRATED CIRCUITS

FIELD OF THE INVENTION

The invention relates to the testing of integrated circuits, and more particularly to a system and method for identifying paths within an integrated circuit that may cause late arrival of signals.

BACKGROUND OF THE INVENTION

Identifying paths that fail or nearly fail timing requirements is a difficult problem all makers of high performance VLSI circuits face. Today's high performance microprocessors have millions of transistors and clock frequencies of up to 500 MHz. In the near future, we are likely to see microprocessors with 50 million transistors running at clock frequencies of 1 GHz and higher. This presents tremendous opportunity for signal paths to become timing hazards.

A diagnostics application that can identify timing failures is a key need for which there has heretofore been no known solution. A particularly frustrating problem occurs when an IC is exercised with functional patterns and performs successfully at longer cycle times, but fails as cycle times are shortened. The problem to be addressed by this invention is that of identifying what logical path(s) caused the failure in such circumstances; that is, which latch first contained an incorrect value, and along what logical path should the correct value have arrived. This problem is difficult to solve with current tools because when an incorrect value appears at an observable pinout, this gives little information on when an incorrect value was first latched in an internal memory element. There are no efficient ways to identify either the clock cycle at the end of which some memory element contains an incorrect value for the first time, or the fault containing memory element itself. There are several inefficient means for performing these tasks, such as using repeated scan outs, but they all require extensive manual intervention, as well as the ability to scan out (or observe by some other means) the contents of the "faulty" latch.

SUMMARY OF THE INVENTION

It is an object of the invention to provide a system and method for detecting the presence of signal propagation delays in an integrated circuit.

It is a further object of the invention to identify particular paths in an integrated circuit that have longer propagation delay than reference paths or given delay values.

In furtherance of these objectives, a system is provided for identifying paths that result in late arriving signals in an integrated circuit, the system comprising: means for providing a chip suspected of generating activity beyond a certain clock cycle duration; means for determining the duration T of a signal that would result in a timing failure of the integrated circuit; means for determining the duration T' of a signal that would not result in a timing failure of the integrated circuit, where T'=T+ΔT; means for applying a test signal of cycle time T' to the integrated circuit and monitoring chip activity during the period ΔT, occurring after a period T from the beginning of the test signal period until the end of the test signal period; means for identifying the location of each occurrence of undesired switching activity in the integrated circuit during the period ΔT; and means for determining from each identified location each path in the circuit that included switching activity during period ΔT.

DETAILED DESCRIPTION OF A PREFERRED EMBODIMENT OF THE INVENTION

In accordance with the present invention, a signature is derived for a circuit under test, wherein the signature can identify failures due to a path that did not complete its switching activity through to a latch element within the allotted clock cycle time, wherein the term "path" is understood to include one or more paths. An important component of the signature is the activity of circuit components following the time when all activity on the chip should have been completed for the particular input applied to the circuit. If the allotted time for completion of switching events is extended, the chip can be observed for such late switching events. This concept will now be described with further respect to the timing diagrams of FIG. 1.

Figure 1:
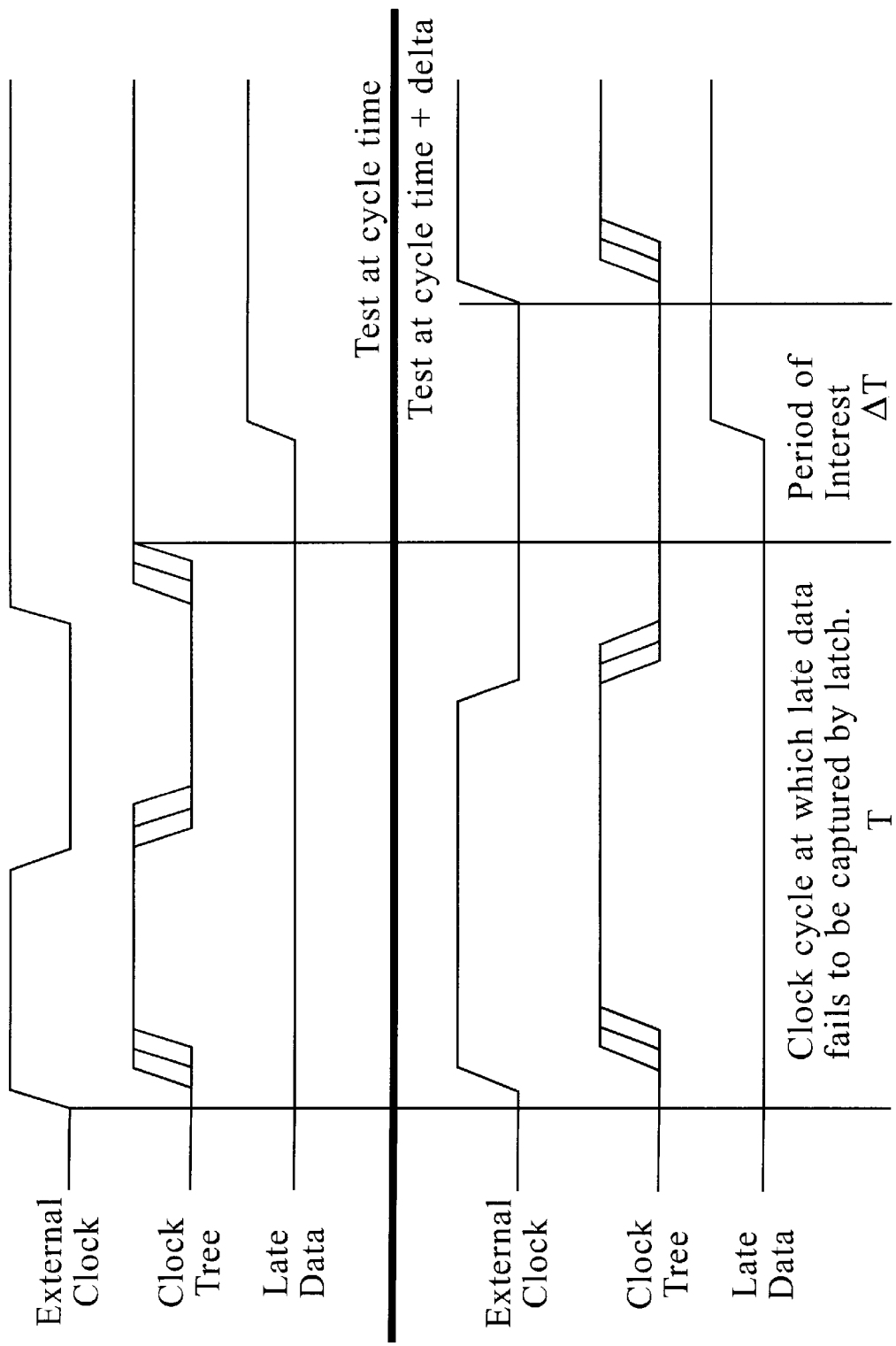
FIG. 1 is a timing signal diagram illustrating the relevant time periods in which faulty circuit performance can be detected in accordance with the invention.

FIG. 1 shows two cases. The first case, at the top of the diagram, shows one cycle of an external clock signal, along with the resulting clock tree pulses that are generated throughout the chip. As can be seen, the various clock tree pulses will have various leading and trailing edge times, owing to their different locations in the clock tree. Also shown is a signal labeled "late data". As can be seen, this transition from a low value to a high value does not occur until after the occurrence of the external and clock tree leading edges. Thus, if this data had not yet reached its destination in the chip before the leading edge of the clock tree signal, then the data would have been lost. It is errors of this nature that the present invention is particularly suited to detect.

A second case is shown in the lower portion of FIG. 1. In this case, the clock cycle time is increased by some value "delta". The corresponding clock tree signals are therefore shown to also be delayed by some value related to "delta". The late data transition in this case occurs at the same time as in the first example, relative to the start of the first clock cycle. The value "delta" is specifically selected to ensure that the "late data" signal arrives in what is labeled the "period of interest", i.e., after the occurrence of the leading edges of a clock signal of duration "cycle time" but before the occurrence of the leading edge of a clock signal of duration "cycle time+delta". Again, it is the presence of errors such as these that the invention is particularly suited to detect. In accordance with the invention, the system and method described herein observe chip activity during this "period of interest" to gather useful information about the circuit that allows detection of the location of delays that resulted in the late-arriving pulse.

In an initial phase of testing, the chip will be sequentially subjected to test inputs of lower and lower period durations (higher and higher frequencies). At some point, the chip will produce an erroneous output. The period of interest is derived from the knowledge of the lowest cycle time in which a failure did not result T', and the knowledge of the cycle time at which a failure did result T.

In accordance with the invention, when a failure occurs during chip testing, the signature is derived by observing circuit activity after the allotted time for arrival has expired T, and before T', which we have defined as the period of interest. Such failure indicates that there was probably activity on a circuit path after the original time allotted to the clock cycle has passed. In accordance with the invention, the IC will be tested with cycle time of T'=T+ΔT, where ΔT is some convenient time increment less than T, for example 0.5 T. The selection of the time increment ΔT may be used to detect one or more failing paths. By setting ΔT very small, a small number of failing paths will be found (setting ΔT=0 will result in the detection of no failing paths). By incrementally increasing ΔT, more and more failing paths may be detected. When ΔT=0, The sequence of functional patterns that caused the failure is then applied, and the activity over the full chip is observed over the period of interest ΔT. Clocking schemes such as two-phase clocking and dynamic circuit clocking may also be tested in accordance with the invention, but will require additional conditioning of the test pattern set or clock edge settings, or specific spatial targeting for the measurement to reduce or eliminate circuit activity not associated with the fail.

In a preferred implementation of the invention, the observation of chip activity will be made with an optical tool, such as that described in commonly owned and copending U.S. patent application Ser. No. 08/683,837, entitled NONINVASIVE OPTICAL METHOD FOR MEASURING INTERNAL SWITCHING AND OTHER DYNAMIC PARAMETERS OF CMOS CIRCUITS, filed Jul. 18, 1996 (IBM Docket No. YO996-121), which is hereby incorporated herein by reference. If the IC were working correctly, no activity should be observed in paths of interest during the time interval ΔT. The presence of activity during this period ΔT, indicated by light emission in the case of an optical tool, identifies both the clock cycle at which the fail occurs first as well as the location on the chip where the fail occurs. In the event that no information is known about the location of the failure beforehand, this first identification has to be done while observing the entire chip. If some knowledge of the likely location of the failure is known a priori, such as from the nature of the functional patterns that were applied, then the failure detection activity can be confined to the particular region of the chip, thereby simplifying the analysis. Once the approximate location is known, either from the a priori knowledge or from a chip-wide analysis, a smaller area can be observed to identify circuit activity at the individual transistor level that contributes to the abnormal activity.

Knowing the identity of the transistors and the sequence of their switching will allow the identification of the long path(s). Identification of the transistors can be performed using an enhanced layout vs. schematic (LVS) application. Once the transistors are identified subsequent detailed analysis, including path identification, can be made. See commonly owned and copending U.S. patent application Ser. No. 09/026,288, entitled "System and Method for Determining the Delay Makeup of a Circuit" (IBM Docket No. YO998-070) filed on even date herewith.

Figure 2:
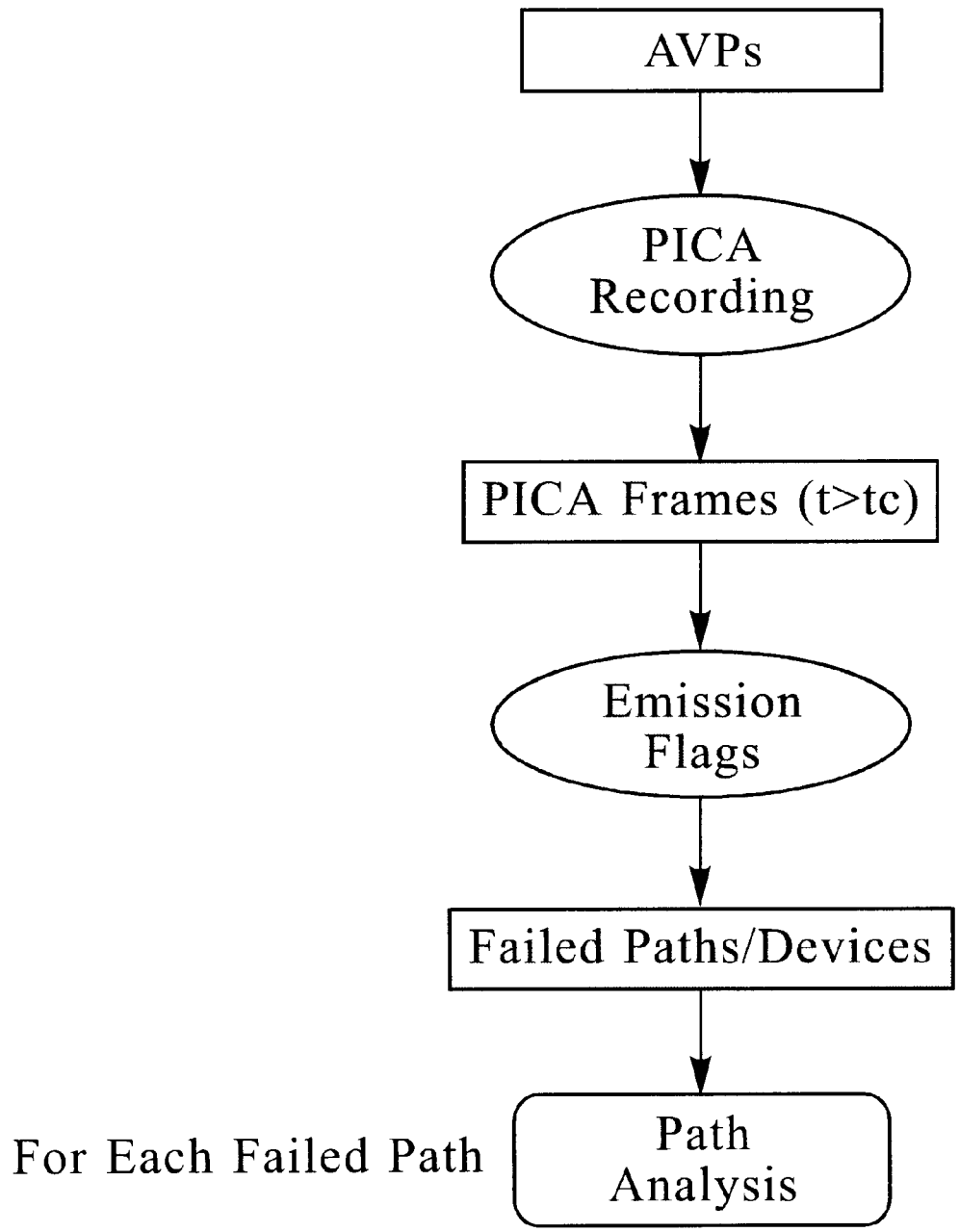
FIG. 2 is a flow diagram illustrating a method for identifying failing paths in accordance with one embodiment of the invention.

An embodiment of the long path identification methodology for timing related failures is shown as a flowchart in FIG. 2. The process begins by repeatedly applying 'a previously generated, stored, and simulated pattern set' to the chip under test, at lower and lower cycle times (higher and higher frequencies). These patterns will have been selected in order to test certain capabilities of the chip, for instance, to test whether a particular circuit on the chip is performing as designed to produce an expected output.

As described above, if an error is detected, as evidenced by the chip's production of an erroneous output, an image of circuit activity is generated for the time period between T and T', or ΔT, the region referred to as "Period of Interest" in FIG. 1. This image is generated by creating a single exposure which will include all switching activity during the ΔT period.

The devices that emitted light during the ΔT period are then flagged automatically by the chip imaging system. This allows association of the failing paths with the various late-switching transistors. Once the faulty paths have been identified, they can be analyzed to determine the cause of the malfunction.

Figure 3:
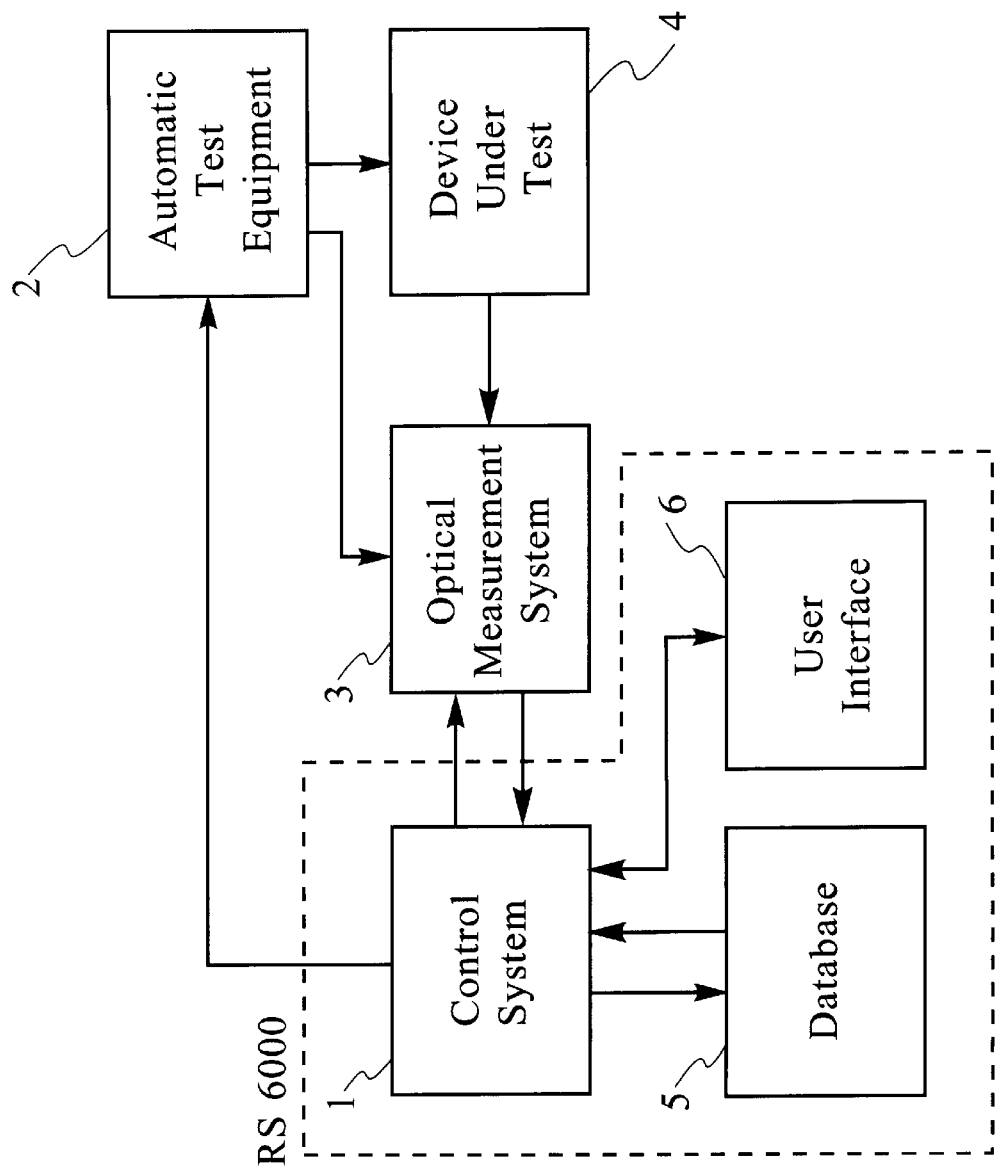
FIG. 3 is a functional block diagram of a system for identifying failed paths in accordance with one embodiment of the invention.

FIG. 3 shows a functional block diagram of a system for identifying faulty paths in accordance with one embodiment of the invention.

The methods described herein can be performed by suitably programming a general purpose computer. The general purpose computer will embody the control system 1, user interface 6 and database 5 functions of the invention, and will interface with automatic test equipment 2 and optical measurement system 3, as described in detail below.

The user interface 6 allows a user to control non-automated functions of the system, such as setting the magnification of imaging capability of the optical measurement system 3, controlling movement of the stage supporting the chip under test, and registering the field of view of the imaging tool with circuit design layout data.

The database 5 stores information describing the circuit under test and the layout of that circuit on the chip embodying the circuit, in the form of a circuit net list and design layout data, respectively.

When a test of a chip is to be performed, the control system 1 sends a corresponding control signal to automatic test equipment (ATE) 2. ATE 2 can be any suitable ATE device, such as a Hewlett Packard model HP83000 or Teradyne J3 86 testing apparatus. ATE 2 will coordinate the through appropriate control signals, of the device under test and the optical measurement system 3 in order to obtain an image of the chip's operation during the period of interest ΔT. Specifically, ATE 2 will apply an input signal selected to test a particular function of the chip to the input of the device under test 4. Simultaneously, ATE 2 will provide a clock reference signal to the optical measurement system 3 to signal the beginning of the test cycle. From previous testing of the device under test, it will be known that the chip (or certain paths within the chip) operates properly for a cycle time T', but fails when the cycle time is reduced to T, where T'−T=ΔT. Thus, in accordance with the invention, the optical measurement system can be programmed to obtain an image of all chip switching activity responsive to the input signal applied by equipment 2, but only during the period of interest ΔT. The optical measurement system 3 will accumulate the switching information in the form of x, y and t data, that is, the x,y coordinate of the physical location of each switching event, and the time or times at which switching activity occurred at that location. The accumulated coordinate and time data will then be provided to the control system 1.

The location data accumulated by system 3 will be compared with the design layout data to determine the name of each transistor in the integrated circuit that switched during the period of interest ΔT, and the name of the transistor can be used along with the circuit net list data to identify the paths containing that transistor that resulted in the fault. When the failing path has been identified, it can then be analyzed to determine the reason for the fault, and can be redesigned as appropriate. The results of this test can be displayed to the user via the user interface.

While the invention has been described in particular with respect to preferred embodiments thereof, it will be understood that modifications to the disclosed embodiments can be effected without departing from the spirit and scope of the invention. For instance, while some of the techniques have been described with respect to single path analysis, it will be recognized by those skilled in the art that the ideas can be extended to analysis of multipath failures within the teachings of the invention.

We claim:

1. A method for identifying a path in an integrated circuit that failed in response to a first input signal having a cycle time T of a first duration, comprising:

a) applying to the integrated circuit an input signal of a second cycle time, T', greater than the first cycle time, the input signal of the second cycle time not resulting in a failure of the integrated circuit;

b) while the integrated circuit is processing the signal of the second cycle time T', observing switching activity in the integrated circuit occurring after a time T measured from the beginning of the signal of the second cycle time until time T' measured from the beginning of the signal of the second cycle time, this time period of observance being defined as $\Delta T$;

c) recording the location in the integrated circuit of all switching activity occurring during time period $\Delta T$ and determining from the recorded location data the path or paths that resulted in failure of the integrated circuit.

2. The method of claim 1, further comprising comparing the location of a switching event during $\Delta T$ with stored design layout data to determine the identity of a device in the integrated circuit that caused the switching event.

3. The method of claim 2, further comprising comparing the identity of the device that caused the switching event with a net list defining the logical configuration of the circuit.

4. The method of claim 1, further comprising recording, along with the location of all switching activity, the time at which such switching activity occurred.

5. The method of claim 1, wherein the switching activity is observed using an optical measurement system capable of detecting light emissions from switching transistors.

6. A system for identifying a path in an integrated circuit that failed in response to a first input signal having a cycle time T of a first duration, comprising:

a) means for applying to the integrated circuit a second input signal of a second cycle time, T', greater than the first cycle time T, the input signal of the second cycle time not resulting in a failure of the integrated circuit;

b) means for detecting the location of switching activity in the integrated circuit during the processing of the second input signal;

c) means responsive to data indicating the location of switching activity in the integrated circuit during the period $\Delta T$, for determining the identity of each path in the integrated circuit that includes a device that switched during the period $\Delta T$.

7. The system of claim 6, wherein the means for applying the second input signal is an ATE system.

8. The system of claim 6, further comprising a database storing a net list describing the logical configuration of the integrated circuit and mask shape data describing the physical layout of the integrated circuit and its relation to the logical configuration.

9. The system of claim 8, wherein the means for determining the identity of the path comprises means for comparing the data indicating the location of the switching activity with the mask shape data.

10. The system of claim 6, further comprising means for detecting the time of each switching event during the period $\Delta T$.

11. The system of claim 6, wherein the means for detecting the location of the switching activity is an optical measurement system capable of detecting light emissions from switching transistors.

12. A method for identifying paths that result in late arriving signals in an integrated circuit, comprising:

providing a chip suspected of generating activity beyond a certain clock cycle duration;

determining the duration T of a signal that would result in a timing failure of the integrated circuit;

determining the duration T' of a signal that would not result in a timing failure of the integrated circuit, where $T'=T+\Delta T$;

applying a test signal of cycle time T' to the integrated circuit and monitoring chip activity during the period $\Delta T$, occurring after a period T from the beginning of the test signal period until the end of the test signal period;

identifying the location of each occurrence of undesired switching activity in the integrated circuit during the period $\Delta T$;

determining from each identified location each path in the circuit that included switching activity during period $\Delta T$.

13. A system for identifying paths that result in late arriving signals in an integrated circuit, comprising:

means for providing a chip suspected of generating activity beyond a certain clock cycle duration;

means for determining the duration T of a signal that would result in a timing failure of the integrated circuit;

means for determining the duration T' of a signal that would not result in a timing failure of the integrated circuit, where $T'=T+\Delta T$;

means for applying a test signal of cycle time T' to the integrated circuit and monitoring chip activity during the period $\Delta T$, occurring after a period T from the beginning of the test signal period until the end of the test signal period;

means for identifying the location of each occurrence of undesired switching activity in the integrated circuit during the period $\Delta T$;

means for determining from each identified location each path in the circuit that included switching activity during period $\Delta T$.

14. A method for identifying paths that result in late arriving signals in an integrated circuit, comprising:

providing a chip suspected of generating activity beyond a certain clock cycle duration;

determining the pulse width of a signal that would result in a timing failure of the integrated circuit;

determining the pulse width that would not result in a timing failure of the integrated circuit, where $T'=T+\Delta T$;

applying a test signal with a portion stretched to T' to the integrated circuit and monitoring chip activity during the period $\Delta T$, occurring after a period T from the beginning of the portion of the test signal period until the end of the stretched test signal period;

identifying the location of each occurrence of undesired switching activity in the integrated circuit during the period $\Delta T$;